United States Patent [19]

Uchino

[11] Patent Number: 5,246,024
[45] Date of Patent: Sep. 21, 1993

[54] CLEANING DEVICE WITH A COMBUSTIBLE SOLVENT

[75] Inventor: Masahide Uchino, Tokyo, Japan

[73] Assignee: Japan Field Company, Ltd., Japan

[21] Appl. No.: 849,804

[22] Filed: Mar. 11, 1992

Related U.S. Application Data

[63] Continuation of Ser. No. 584,529, Sep. 18, 1990, abandoned.

[30] Foreign Application Priority Data

Sep. 19, 1989 [JP] Japan ............................ 1-242710
Oct. 16, 1989 [JP] Japan ............................ 1-268765

[51] Int. Cl.⁵ .................................................. B08B 3/02
[52] U.S. Cl. .................................. 134/64 R; 134/105; 134/114; 134/122 R
[58] Field of Search ........... 134/108, 105, 114, 73, 134/74, 64 R, 122 R, 199; 68/5 E

[56] References Cited

U.S. PATENT DOCUMENTS

| | | | |
|---|---|---|---|
| 2,273,939 | 2/1942 | Dammers | 134/74 |
| 2,374,535 | 4/1945 | Gibson | 134/114 X |
| 2,923,648 | 2/1960 | K'Burg | 134/114 X |
| 3,021,235 | 2/1962 | Schumacher | 134/114 X |
| 3,058,327 | 10/1962 | Hablutzel | 68/5 E |
| 3,491,779 | 1/1970 | McLain et al. | 134/108 X |
| 3,552,404 | 1/1971 | Kuhn | 134/114 |
| 3,595,254 | 7/1971 | White | 134/114 X |
| 3,656,492 | 4/1972 | Holm et al. | 134/108 X |
| 3,824,917 | 7/1974 | Kawahara et al. | 134/114 |
| 4,184,892 | 1/1980 | Anderson | 134/114 |
| 4,326,556 | 4/1982 | Deutsch et al. | 134/114 |
| 4,596,634 | 6/1986 | McCord | 134/122 R |
| 5,045,120 | 9/1991 | Mittag et al. | 134/73 X |

*Primary Examiner*—Frankie L. Stinson
*Attorney, Agent, or Firm*—Klauber & Jackson

[57] ABSTRACT

A cleaning device having a storing tank storing non-combustible or incombustible liquid, a covering member being formed by placing a lower end opening in the stored liquid in the storing tank, the combustible solvent and the cleaned object being brought into contact with the covering chamber of a spacing formed by the covering member and the stored liquid to constitute the cleaning part for performing the cleaning operation.

14 Claims, 5 Drawing Sheets

CLEANING DEVICE WITH A COMBUSTIBLE SOLVENT

Cross Reference to Related Applications

This application is a continuation of U.S. application No. 07/583,529 filed on Sep. 18, 1990, now abandoned.

BACKGROUND OF THE INVENTION

1. Field of the Invention

This invention relates to a cleaning device with combustible solvent and further relates to a cleaning device for performing a safe cleaning of mechanical components or printed circuit boards of the like with combustible solvent.

2. Description of the Prior Art

In order to clean the mechanical components and some printed circuit boards or the like in the prior art, in general, freon solvents have been applied due to their non-combustible characteristic and no dangerous state of ignition as well as their superior cleaning power. However, their uses have been restricted legally due to the fact that they may damage an enviromental circumstance of the earth. As solvents in place of the freon solvents, there have been considered to employ terpene solvent having as its major agent oil extracted from orange and composition of mixture of terpene solvent and terpene emulsifying surface active agent, solvents such as alcohol and kerosene or the like. However, they are combustible solvents of which safety against ignition may not be assured, resulting in that their uses may not be applied.

SUMMARY OF THE INVENTION

This invention aims at resolving the aforesaid problems and it is an object of the present invention to prevent any dangerous state of ignition while using the combustible solvents having a superior cleaning power and not providing any damage of environment of the earth and further to perform a continuous and efficient safe cleaning operation.

In order to accomplish the aforesaid object, the present invention is constructed such that a storing tank for storing non-combustible or incombustible liquid, i.e. liquid stored in the storing chamber (hereinafter called as stored liquid) is provided, a sealingly closed covering member having its lower end opening inserted into the stored liquid in the storing tank and sealingly closed is formed, and then a covering chamber of this sealingly closed covering member is formed with a cleaning part to cause the combustible solvent to be contacted with the materials to be cleaned.

In addition, the present invention is constructed such that the storing tank having non-combustible or incombustible stored liquid therein is arranged, the covering member for inserting the lower end opening into the stored liquid of the storing tank except a feeding port for the materials to be cleaned is formed, and then the covering chamber to be covered by the covering member is formed with a cleaning part for performing a cleaning operation by contacting the combustible solvent with the materials to be cleaned.

Since the present invention is constructed as described above, when the materials to be cleaned are washed with combustible solvent at the cleaning part for contacting the combustible solvent with the cleaned materials, the solvent vapor or splashings generated through this cleaning operation may be placed in the sealingly closed covering member with its lower end opening being inserted into the stored non-combustible or incombustible stored liquid and may not be leaked out. Accordingly, if there is no material to ignite in the sealingly closed covering member, a dangerous state of ignition is eliminated. Even if there is a slight cause to generate ignition, it becomes possible to reduce a dangerous state of ignition due to the fact that the sealingly closed covering member has its lower end opening closed by the stored non-combustible or incombustible liquid.

In addition, if the stored liquid is water, it is economical and the water can keep its incombustibility, it is possible to get a high safety against the ignition.

If the stored liquid is incombustible oil having a high boiling point and solvent such as alcohol which can be dissolved, it is possible to prevent the solvent from being dissolved into the stored liquid and further to prevent the stored liquid from being ignitable.

The combustible solvent may be terpene solvent or composition composed of terpene solvent and terpene emulsifying surface active agent, may be alcohol or kerosene or any type of solvent of combustibility.

In addition, if the opening part of the sealingly closed covering member is immovably inserted into the stored liquid, a supplying of the objects to be cleaned to the cleaning part through the stored liquid by a conveyor can be simplified with a simple mechanism and at the same time a cleaning of the continuous objects to be cleaned can be performed.

If the sealingly closed covering member can be advanced toward or retracted from the stored liquid and the opening is formed such that it may be contacted with and removed from the stored liquid, it is possible to form a transferring passage for the objects to be cleaned in a horizontal state, a relative large object to be cleaned can be easily cleaned. Even in case that the system is to be connected to another processing device for processing the objects to be cleaned, it becomes possible to transmit the objects to be cleaned continuously from the processing device to the cleaning device.

If the contact between the combustible solvent and the objects to be cleaned at the cleansing part is carried out by injecting the combustible solvent in a shower form to the objects to be cleaned, it becomes possible to make a strong cleaning of the entire objects to be cleaned.

If it is assumed that the contact between the combustible solvent and the objects to be cleaned at the cleaning part is carried out while the cleaning target part of the object to be cleaned is being contacted with the liquid surface of the combustible solvent within the charging tank stored in the covering chamber, only one surface of the flat plate such as a printed circuit board or the like can be cleaned and further it becomes possible to improve an efficiency of cleaning and to prevent the cleaning liquid from being contacted through the contact with the cleaning liquid to a part not preferred.

If means for recovering the splashed solvent is connected to the covering chamber, it becomes possible to decrease a concentration of the vapor or splashed combustible solvent in the covering chamber and further it becomes possible to further reduce a dangerous state of ignition.

If a transferring of the object to be cleaned is carried out such that a chain conveyor is passed from outside the sealingly closed covering member through the stored liquid, fed into the cleaning part within the sealingly closed covering member, then the fed chain conveyor is projected out of the stored liquid in a feeding direction of the object to be cleaned and circulated, a continuous cleaning of the objects to be cleaned can be carried out with a simple mechanism.

In addition, the present invention is constructed as described above, resulting in that if the objects to be cleaned are cleaned at the cleaning part to cause the combustible solvent to be contacted with the objects to be cleaned, the solvent vapor and the splashed solvent generated by this cleaning operation are accumulated within the covering member having the lower end opening inserted therein in the stored non-combustible or incombustible liquid, there is no place where the solvent vapor or the splashed solvent or the like may leak outside other than the inlet port of the objects to be cleaned, and so if the substance igniting is not placed within the covering member, a dangerous state of ignition is remarkably reduced. In addition, even if a slight cause of ignition is generated, the covering member has merely the lower end opening inserted into the stored non-combustible or incombustible liquid and a slight inlet port for the cleaned objects, so that it becomes possible to reduce a dangerous state of the ignition. Since the covering chamber has the feeding inlet port for the cleaned objects, it becomes always possible to feed the cleaned objects continuously and then an efficient cleaning work can be carried out.

If the stored liquid is non-combustible oil with a high boiling point, it becomes possible to prevent a dissolution of the solvent into the stored liquid when the solvent such as alcohol dissolving into water and to prevent a combustion of the stored liquid. In addition, as found in the water, there is no reduction in volume of the liquid due to an evaporation and a rust of the applied members can be prevented from being generated.

Since the covering member is made such that its opening part is inserted into the stored liquid immovably except the inlet port for the cleaned objects, a power for operating the covering member is eliminated and then an economical cleaning work can be obtained.

Further, since the covering member is arranged in such a way as it may be advanced or retracted in respect to the stored liquid and the inlet port can be inserted into the stored liquid in case of non-cleaning operation and the covering can be closed by the stored liquid, it is possible to prevent the solvent vapor or splashed solvent from being leaked out of the inlet port in case of the stopping of the cleaning work and thus a safe keeping of the cleaning device can be attained.

The means for recovering the splashed solvent is connected to the covering chamber and a gas flow is generated from the inlet port for the objects to be cleaned toward the inside of the covering chamber under operation of this recovering means, resulting in that the vapor of the combustible solvent or splashed solvent can be prevented from being flowed out of the inlet ports and then a safe cleaning operation can be attained.

Further, the feeding of the cleaned objects into the covering chamber is performed at the inlet ports and the feeding-out of the cleaned objects from the covering chamber is carried out through the stored liquid, resulting in that a continuous and efficient cleaning of the cleaned objects can be performed while preventing the dispersion of the vapor of the combustible solvent and its splashed solvent.

The above and other objects, advantages and features of the present invention as well as its applications will become apparent from the following description in reference to the accompanying drawings.

DESCRIPTION OF THE PREFERRED EMBODIMENTS

The preferred embodiments of this invention are described in detail hereinafter with reference to the accompanying drawings.

Figure 1:
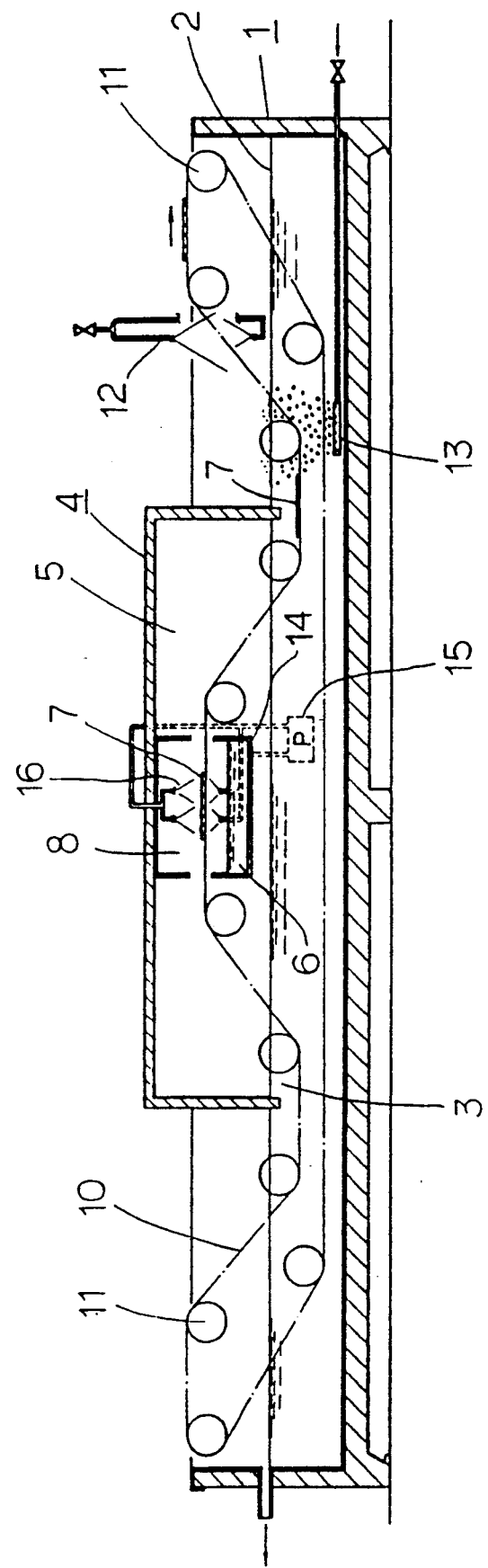
FIG. 1 is a sectional view for showing a state in which a sealingly closed covering member is fixedly arranged.

The First Embodiment (FIG. 1)

(1) denotes a storing tank for use in storing the stored liquid (2) of non-combustible feature such as incombustible water or non-combustible oil with a high boiling point. If the stored liquid (2) is water, it is more economical and its incombustible characteristic can be kept, resulting in that it is possible to get a high safety in the cleaning operation. In addition, if the stored liquid (2) is a thermal medium oil with a high boiling point, a cutting machine, non-combustible oil such as a spindle oil or the like, a dissolving of the solvent into the stored liquid (2) is prevented in case of using the solvent which can be dissolved into water, such as alcohol or the like and then the stored liquid (2) can be prevented from being combustible.

A sealingly closed covering member (4) having its lower opening end (3) inserted and sealingly closed in the stored liquid (2) of the storing tank (1) is formed and further a cleaning part (8) for contacting the combustible solvent (6) with the cleaned objects (7) is formed at the covering chamber (5) arranged within the sealingly closed covering member (4). Then, although the combustible solvent (6) is not limited to any particular type if it is coincided with the purpose of cleaning, it is preferable that in case of cleaning the flux residuals at the printed circuit board, terpene solvent or composition composed of terpene solvent and terpene emulsifying surface active agent are applied. As the combustible solvent (6), it is also possible to use any combustible solvent such as alcohol and kerosene or the like in response to the purpose of other cleanings.

The aforesaid sealingly closed covering member (4) has an immovable opening (3) inserted into the stored liquid (2). Then, as shown in FIG. 1, a chain conveyor (10) is fed from an outer part of the sealingly closed covering member (4) to the cleaning part (8) within the sealingly closed covering member (4) through the stored liquid (2) by a sprocket wheel (11). Then, this fed chain conveyor (10) is projected out of the stored liquid (2) toward a feeding-out direction of the cleaned object (7), and a washing shower (12) for use in removing the combustible solvent (6) adhered to the cleaned object (7) is arranged at the projected portion. In addition, a bubble generating part (13) such as air bubble injection port or an ultrasonic vibrator or the like is arranged in front of the water washing shower (12).

The cleaning part (8) within the sealingly closed covering member (4) is provided with a charging tank (14) having the combustible solvent (6) stored therein and the combustible solvent (6) pressurized by a pump (15) is blown from both upper and lower surfaces of the cleaned objects (7) passing over the charging tank (14) so as to perform the cleaning work. With such an arrangement as above, it is possible to clean the cleaned objects (7) with a more simple configuration and at the same time a continuous cleaning of the cleaned objects (7) can be carried out.

Figure 2:
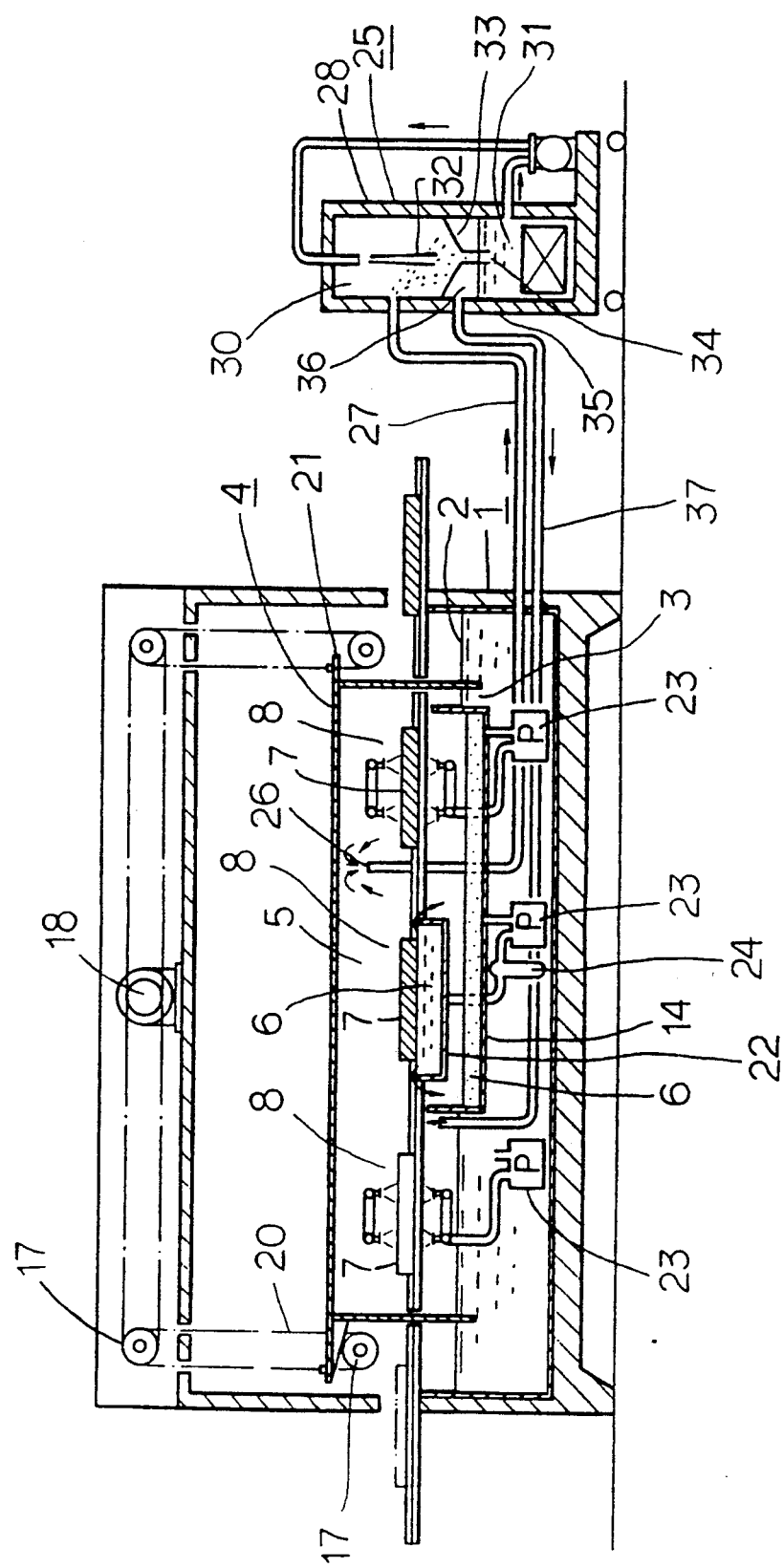
FIG. 2 is a sectional view for showing a state in which the sealingly closed covering member arranged to be movable up and down is lowered.
Figure 3:
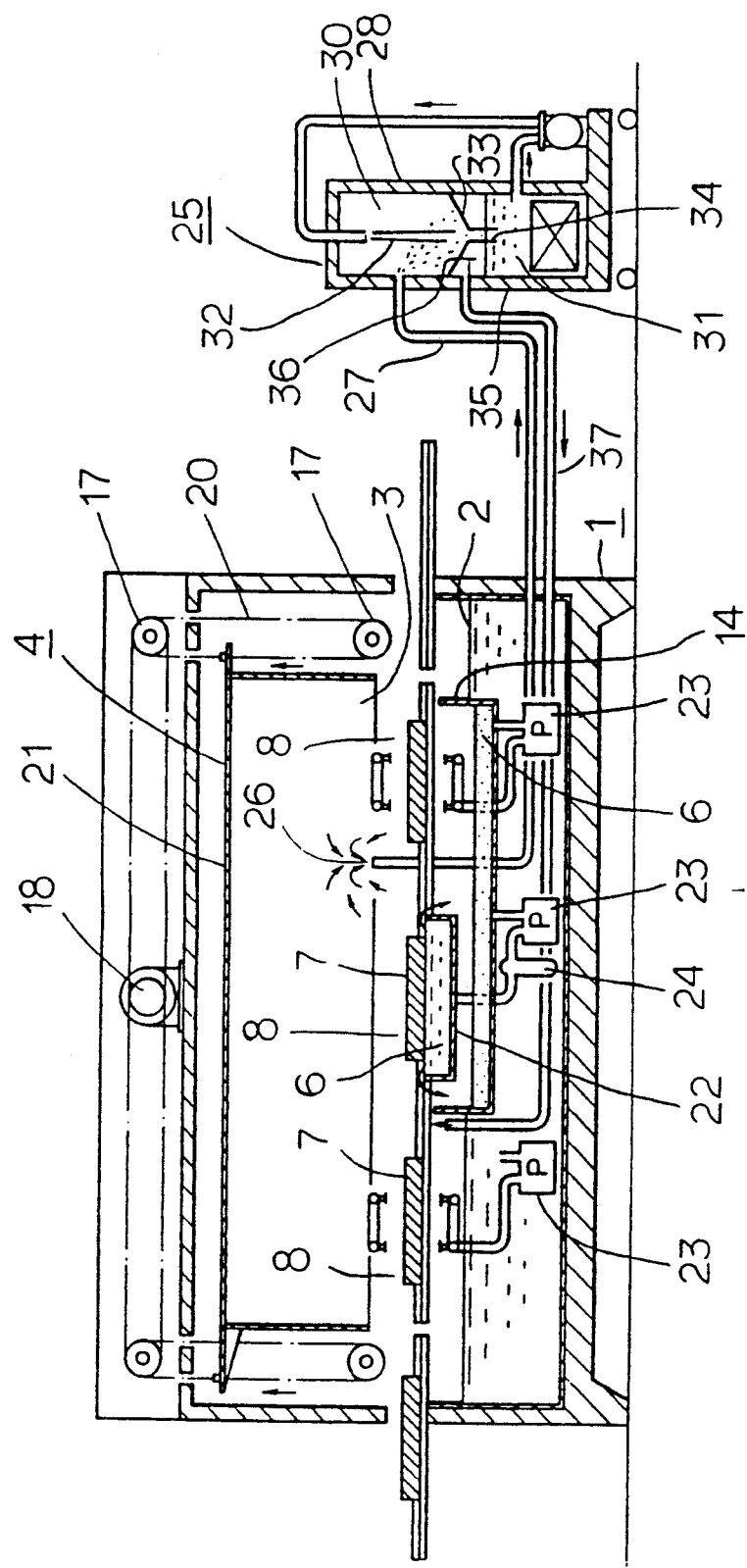
FIG. 3 is a sectional view for showing a state in which the covering member arranged to be movable up and down is lifted.

The Second Embodiment (FIGS. 2 and 3)

Although in the first preferred embodiment, the sealingly closed covering member (4) is contacted with the stored liquid (2) in such a way as it may not be moved up or down, the second preferred embodiment is constructed such that as shown in FIGS. 2 and 3, the opening (3) is arranged in such a way as it may be advanced to or retracted from the stored liquid (2) and then it may be inserted into or retracted from the stored liquid (2). With such a formation as above, it is possible to form a horizontal transferring path for the cleaned objects (7) and then relatively large-sized cleaned objects (7) can easily be cleaned. In addition, at a connection with the other processing devices for use in processing the cleaned objects (7), a replacement from the processing device is not needed and a continuous feeding of the cleaned object (7) to the cleaning device can be carried out.

Upward or downward movement of the aforesaid sealingly closed covering member (4) is carried out in such a way as a chain (20) driven by the motor (18) is engaged with a sprocket wheel (17) fixedly arranged and then a part of the chain (20) is fixed to a top plate (21) of the sealingly closed covering member (4). It is of course apparent that the upward or downward movement can be selectively performed with any methods. For example, the sealingly closed covering member (4) can be moved up or down by connecting the cylinder to it.

In the first preferred embodiment shown in FIG. 1, only the cleaning part (8) for use in shower cleaning is formed within the sealingly closed covering member (4). However, in the second preferred embodiment, as shown in FIGS. 2 and 3, a plurality of cleaning parts (8) constructed by several types of cleaning means are arranged to enable a cleaning effect to be improved. At first, one effect is such that the combustible solvent (6) in the charging tank (14) is injected in a shower form to the cleaned objects (7) and an entire powerful cleaning of the cleaned objects (7) can be realized. A subsequent cleaning means at the cleaning part (8) is carried out with only the cleaning target part of the cleaned object (7) being contacted with the liquid surface of the combustible solvent (6) within the charging tank (14) stored in the covering chamber (5), in which only one surface of the flat-plate object such as a printed circuit board can be performed and it is possible to improve a cleaning efficiency and prevent the cleaning liquid from being contacted with the portion where its contacting with the cleaning liquid is not preferable. In this case, an over-flow tank (22) is separately arranged from the charging tank (14), the combustible solvent (6) in the charging tank (14) is supplied to the overflow tank (22) through the moisture separator (24) by a pump (23) and only the cleaning target part of the cleaned object (7) is contacted while the combustible solvent (6) being overflowed so as to perform the cleaning operation.

A next cleaning means is a process in which the combustible solvent (6) adhered to the cleaned object (7) is cleaned and removed by the stored liquid (2) within the storing tank (1) through the aforesaid cleaning work. Each of the aforesaid cleaning means may be applied in a single form or a combination of several types of cleaning means may be applied and they may be determined optionally in response to the cleaning object. In addition, a further cleaning means, for example, an immersion type cleaning tank may be mounted.

The solvent vapor and splashed solvent generated by the aforesaid cleaning operation are positioned within the sealingly closed covering member (4) with its lower end opening (3) inserted into the stored non-combustible or incombustible liquid and sealingly closed and they are not leaked out of the tank, so that if there is no object to ignite within the sealingly closed covering member (4), the dangerous state of ignition is eliminated. Even if a slight cause of ignition is generated, since the sealingly closed covering member (4) has the lower end opening (3) sealingly closed in the non-combustible or incombustible stored liquid (2), it becomes possible to reduce a dangerous state of ignition. If the recovery means (25) for use in recovering vapor or solvent or splashed solvent is connected to the covering chamber (5) within the sealingly closed covering member (4), it becomes possible to reduce a concentration of the vapor and splashed combustible solvent (6) within the covering chamber (5) and thus a dangerous state of ignition can be further reduced. This recovery means (25) is made as follows. A suction pipe (27) having its suction port (26) projected at an upper part within the covering chamber (5) is connected to a condensing chamber (30) of a recovering tank (28). The vapor and splashed solvent fed from the suction pipe (27) are condensed by a flow-down liquid layer (32) formed by the cooling liquid and then they are separated by the condensing chamber (30) and a partition wall (33). The discharging pipe (37) is connected to an upper spacing (36) of a cooling liquid chamber (35) in which a communication port (34) of the partition wall (33) is inserted into the cooling liquid (31), and then the clean gas within the upper spacing (36) is circulated back to the covering chamber (5). With this arrangement, it is possible to reduce remarkably a concentration of the vapor and splashed combustible solvent (6) within the covering chamber (5).

Since the present invention is constructed as described above, the vapor of solvent and splashed solvent generated by the cleaning operation are not leaked out of the sealingly closed covering member with the lower end opening being sealingly closed by the stored liquid, resulting in that a dangerous state of ignition caused by a spark of an external device and a static electricity is eliminated. Even if a slight cause of ignition is generated, it becomes possible to reduce a dangerous state of ignition by the non-combustible or incombustible stored liquid.

If the stored liquid is water, it is economical and further its non-combustible characteristic can be maintained and a high degree of safety can be attained.

If the stored liquid is of a non-combustible oil having a high boiling point, it is possible to prevent a dissolution of solvent into the stored liquid and further prevent the stored liquid from being combustible in case that the solvent dissolved in the water such as alcohol or the like is applied.

If the sealingly closed covering member is immovably arranged and sealingly closed by the stored liquid, a supplying of the cleaned object to the cleaning part through the stored liquid by a conveyor can be performed with a simple mechanism and then a continuous cleaning of the cleaned objects can be carried out.

If the sealingly closed covering member is arranged in such a way as it may be advanced or retracted in respect to the stored liquid, a transmitting passage of the cleaned objects can be formed in a horizontal orientation and even in case of a relatively large-sized cleaned object, the object may easily be cleaned and a continuity with the processing device with the same being positioned after or before the cleaning device.

In addition, if the contacting of the combustible solvent at the cleaning part with the combustible solvent is carried out with the combustible solvent being injected in a shower-like manner, a powerful cleaning of an entire cleaned object can be performed.

If the contact between the combustible solvent and the cleaned object at the cleaning part is carried out while being contacted with only the cleaning target of the cleaned object, it becomes possible to clean only one surface of the flat object such as the printed circuit board or the like, to improve a cleaning efficiency and prevent a contact of the cleaning liquid with the part of which contact with the cleaning liquid is not preferable.

If the recovery means for use in recovering the dispersed solvent is connected to the covering chamber, it becomes possible to reduce a concentration of the vapor or splashings of the combustible solvent and further to reduce a dangerous state of the solvent against ignition.

Figure 4:
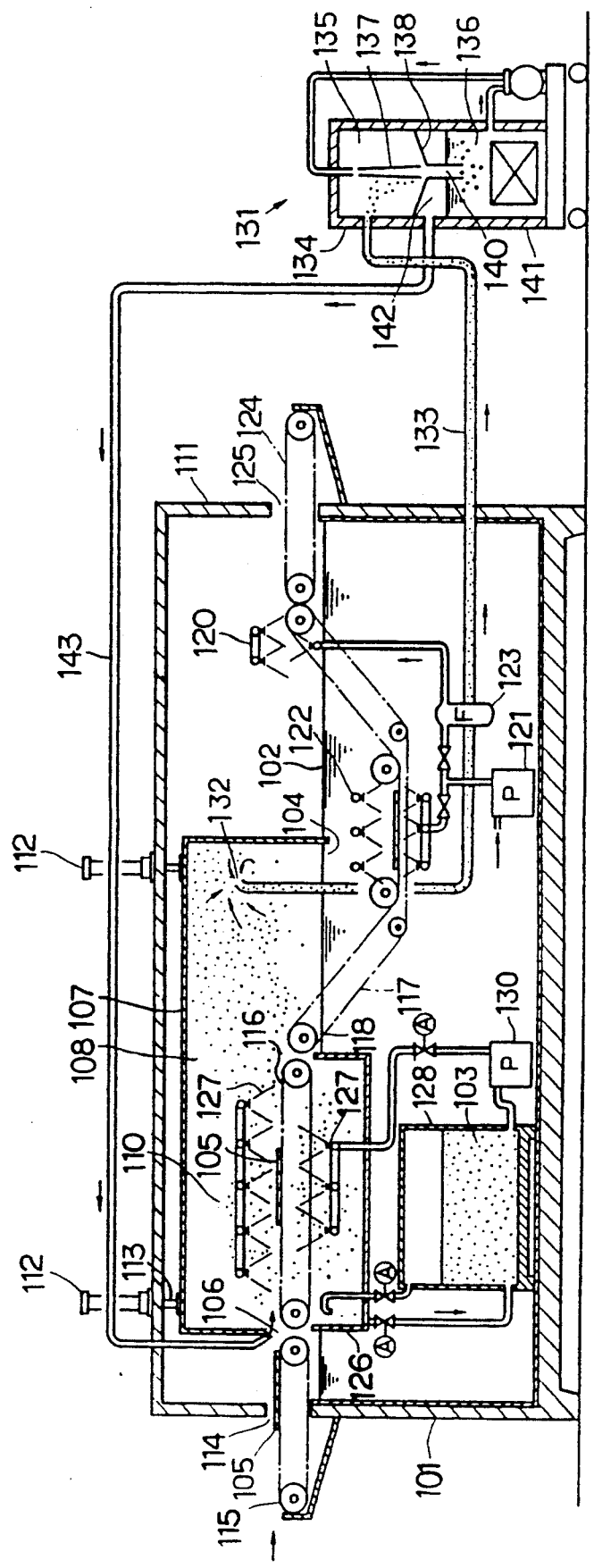
FIG. 4 is a sectional view for showing a cleaning state of the cleaned objects.
Figure 5:
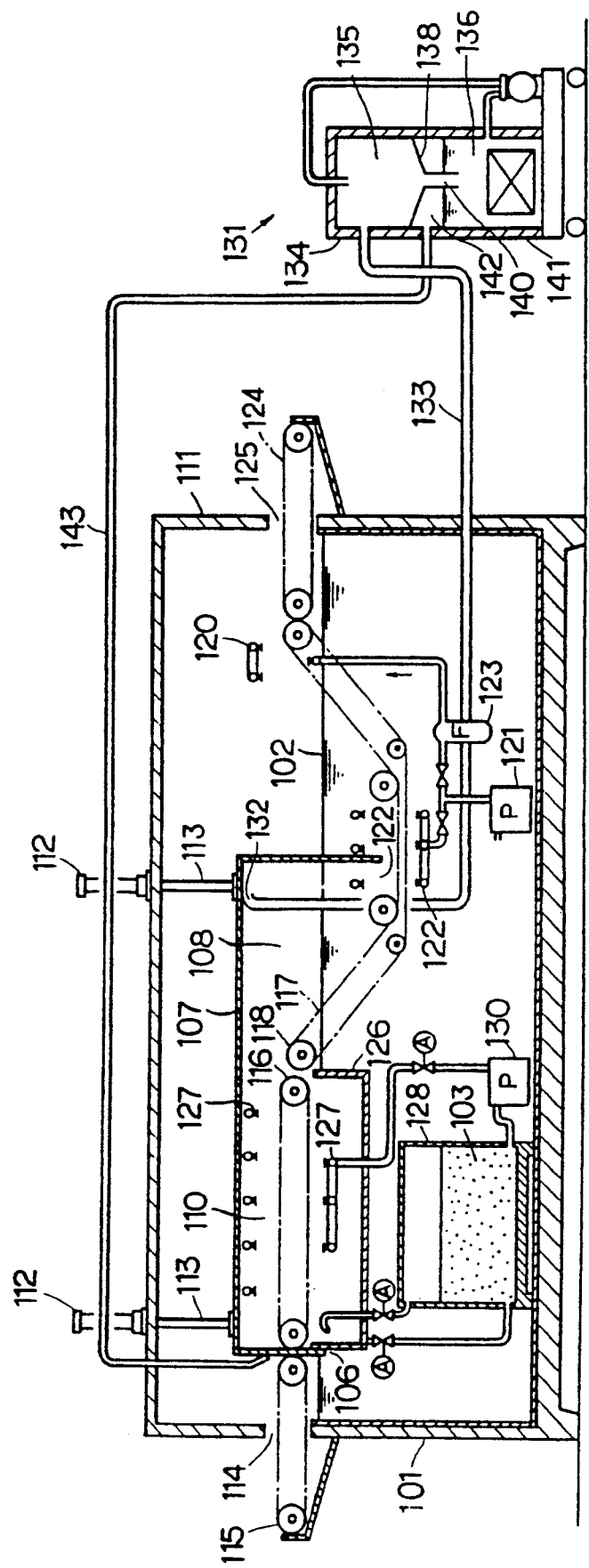
FIG. 5 is a sectional view for showing a non-cleaning state in which the covering chamber is sealingly closed.

The Third Embodiment (FIGS. 4 and 5)

(101) denotes a storing tank for use in storing non-combustible stored liquid (102) such as non-combustible water or incombustible oil of a high boiling point. If this stored liquid (102) is water, it is economical and its incombustibility can be kept, so that a high degree of safety during the cleaning operation can be assured. If the stored liquid (102) is a non-combustible thermal medium oil, cutting oil, spindle oil or the like, it is possible to prevent a dissolution of combustible solvent (103) into the stored liquid (102) and prevent an ignition of the stored liquid (102), prevent an occurrence of reduction in volume caused by evaporation of water and occurrence of rust in a metallic member in case that the combustible solvent (103) dissoluted in water such as alcohol or the like is applied.

A covering member (107) having its lower end opening (104) being inserted except an inlet port (106) for a cleaned object (105) is formed at a stored liquid (102) in a storing tank (101) and then a cleaning part (110) for contacting the combustible solvent (103) with the cleaned object (105) is formed at the covering chamber (108) arranged in the covering member (107). If the combustible solvent (103) is coincided with the purpose of cleaning, it may not be restricted. However, in order to clean flux residues in the printed circuit board, it is preferable to apply terpene solvent, or a composition composed of terpene solvent and terpene emulsifying surface active agent. As the combustible solvent (103), it is possible to apply any combustible solvent such as alcohol and kerosene or the like in reference to other cleaning purposes.

The aforesaid covering member (107) may be made such that the opening (104) is immovably inserted into the stored liquid (102). In the preferred embodiment shown in the figure, the upper surface of the storing tank (101) is covered by a casing (111) together with the covering member (107). The cylinder rod (113) of the cylinder (112) fixed to the upper surface of this casing (111) is passed through the casing (111) and connected to the covering member (107) so as to enable the covering member (107) to be moved up and down. As shown in FIG. 4, in order to clean the cleaned object (105), the covering member (107) is lifted up and the inlet port (106) for the cleaned object (105) is opened in non-contact with the stored liquid (102) and at the same time, the lower end opening (104) of the covering member (107) is inserted into the stored liquid (102), a continuous feeding of the cleaned object (105) into the cleaning part (110) can be performed to carry out the cleaning operation. A casing (111) adjacent to the inlet port (106) is formed with an opening of an insertion port (114) for the cleaned object (105), an inserting conveyor (115) is mounted to facilitate the in-feeding of the cleaned object (105) into the inlet port (106).

The covering chamber (108) within the covering member (107) has a transmitting conveyor (116) in flush with the inserting conveyor (115). A chain conveyor (117) is arranged by sprocket wheels (118) adjacent to the end part of the transmitting conveyor (116) in its transferring direction and then the cleaned object (105) is fed out of the stored liquid (102) from within the covering chamber (108). At this feeding-out part is arranged a water shower (120) for use in removing the combustible solvent (103) adhered to the cleaned object (105). In addition, a primary removing part (122) for sucking and pressurizing the stored liquid (102) with the pump (121) and injecting it to the cleaned object (105) is arranged within the stored liquid (102) before the water shower (120). The cleaned object (105) passed through this primary removing part (122) is secondarily cleaned with the stored liquid (102) through the filter means (123). The cleaning of the cleaned object (105) with the water shower (120) and the primary removing part (122) aims at removing the combustible solvent (103) adhered to the cleaned object (105), so that it is preferable that the combustible solvent (103) is water soluble and the water is applied as the stored liquid.

A feeding-out conveyor (124) is positioned in a feeding direction of the cleaned object (105) of the water shower (120), the feeding-out conveyor (124) is projected out of the feeding-out port (125) arranged in the casing (111) so as to enable the cleaned object (105) to be taken out.

A cleaning part (110) within the covering member (107) is placed with a receiving pan (126) for the combustible solvent (103) being adjacent to the lower surface of the covering member (107), and the showers (127) are arranged adjacent to upper and lower surfaces of the cleaned object (105) passing over the upper part of the receiving pan (126). The combustible solvent (103) of the charging tank (128) installed within the stored liquid (102) is pressurized and supplied by the pump (130) and the combustible solvent (103) is blown from the upper and lower surfaces by the showers (127) so as to perform a cleaning work. With such an arrangement as above, it is possible to perform a cleaning of the cleaned object (105) with a simple mechanism and a continuous cleaning of the cleaned object (105) can be carried out.

The cleaning of the cleaned object (105) is not necessarily depended upon the showers, but it is also possible to perform it with an immersion type cleaning in which the object is immersed in the cleaning liquid composed of combustible solvent.

The solvent vapor and the splashed solvent generated through the aforesaid cleaning work are accumulated in the covering member (107) covered by inserting the lower end opening (104) into the non-combustible or in-combustible stored liquid (102) and the solvent is hardly leaked out of the device, so that if there is no substance to cause ignition left in the covering member (107), there is no danger of ignition. Even if a slight cause of ignition is generated, since the lower end opening (104) of the covering member (107) is covered by the stored non-combustibel or incombustibe liquid (102), so that it is possible to reduce a dangerous state of ignition.

In addition, if the recovery means (131) for recovering vapor, splashed solvent is connected to the covering chamber (108) in the covering member (107), it is possible to reduce a concentration of the vapor and splashed combustible solvent (103) in the covering chamber (108), resulting in that it is possible to further reduce the dangerous state against the ignition. The recovery means (131) is described hereinafter.

The suction pipe (133) projected out of the suction port (132) at the upper part within the covering chamber (108) is connected to the condensing chamber (135) of the recovering tank (134). The vapor and splashed solvent fed from the suction pipe (133) by the flowing-down liquid layer (137) formed by the cooling liquid (136) are condensed and separated by the condensing chamber (135) and the partition wall (138). A discharging pipe (143) is connected to an upper spacing (142) of the cooling liquid chamber (141) arranged with the communication port (140) of the partition wall (138) being inserted into the cooling liquid (136) and then the clean air in the upper spacing (142) is circulated back from the feeding port (106) for the cleaned object (105) into the covering chamber (108). With this arrangement, it is possible to make a remarkable reduction of the concentration of the vapor and splashed combustible solvent in the covering chamber (108), generate an inward flow direction of the gas in the covering chamber (108) through the inlet port (106), prevent a flowing-out of the solvent vapor and splashed solvent from the inlet port (106) and make a positive prevention of the dangerous state of ignition.

It is not necessary to recover the vapor or splashed solvent of the combustible solvent (103) with the condensing mechanism as described above and other optional recovering devices may also be applied. For example, as a mist catcher, the solvent vapor or splashed solvent or the like is sucked with a suction force of the fan and then the solvent may be filtered by a filter. In this case, since the solvent vapor and the splashed solvent vapor as well as the flowing of the filtered gas can be sucked with a large force, a sufficient amount of flow of gas can be generated from the inlet port (106) into the covering chamber (108) and then the flowing-out of the solvent vapor and the splashed solvent or the like from the inlet port (106) can be positively prevented.

Upon completion of the cleaning operation, the cylinders (112) fixed to the upper surface of the casing (111) are operated to lower the covering member (107) as shown in FIG. 5 and the inlet port (106) is inserted into the stored liquid (102). In this way, if the covering chamber (108) is sealingly closed by the stored liquid (102), the flowing-out of the solvent vapor or the splashed solvent from the inlet port (106) during stoppage of the cleaning operation is prevented and then a safe holding of the cleaning device can be carried out.

The present invention is constructed as described above, and the solvent vapor and the splashed solvent generated through cleaning operation are not leaked out of the covering member of which lower end opening is closed by the stored liquid and quite low amount of it is found, so that there is no dangerous state of ignition caused by a spark of the external device and a static electricity or the like. Even if there are some slight causes of ignition, the dangerous state of ignition can be reduced by the stored non-combustible or in-combustible liquid. In case of cleaning operation, the inlet port for the cleaned object is already opened, so that it is possible to perform a continuous feeding of the cleaned object and further it is also possible to perform a continous effective cleaning operation and at the same time if the inlet port is of a minimum size required for in-feeding the cleaned object such as a printed circuit board, a flowing-out of the colvent vapor and the splashed solvent is quite low and then the dangerous state of ignition is absolutely eliminated.

If the stored liquid is water, it is economical and further it is possible to keep a noncombustible characteristic, resulting in that a high degree of safety can be attained.

In addition, if the stored liquid is a non-combustible oil of a high boiling point, it is possible to prevent a dissolution of the solvent into the stored liquid and prevent a combustion of the stored liquid in case that the solvent such as alcohol dissoluble into water is used, and as found in case of water, there is no reduction in volume caused by the evaporation and the occurrence of rust of the applied material can be prevented.

If the contact between the combustible solvent and the cleaned object at the cleaning part is carried out while the combustible solvent is injected in its shower form, a powerful cleaning of the cleaned object can be attained.

If the recovery means for recovering the splashed solvent is connected to the covering chamber, it is possible to reduce the concentration of the vapor of the combustible solvent and the splashed solvent and further to reduce a dangerous state of ignition. Through this recovering means, if the gas flow is generated from this inlet port for the cleaned object toward an inside of the covering chamber, it is possible to prevent a flowing-out of the vapor and splashed combustible solvent through the inlet port and to enable a safe cleaning operation.

In addition, a feeding-out of the cleaned object into the covering chamber is carried out at the inlet port and at the same time, the feeding-out of the cleaned object from the covering chamber is carried out through the stored liquid, the continuous cleaning of the cleaned object can be performed while preventing the vapor and splashed combustible solvent.

What is claimed is:
1. A cleaning device comprised of:
   a storage tank suitable for storing a noncombustible storing liquid;
   a covering member defining a chamber with said storing liquid and having an open feed inlet and a lower end opening suitable for allowing a cleaned object to pass through said inlet, into said chamber, and into the noncombustible storing liquid in the storage tank, said chamber covered by the covering member further being formed with a cleaning apparatus contained within said chamber to perform cleaning operation by contacting the object to be cleaned with a combustible solvent within said chamber, said cleaning apparatus being further comprised of a recovering means for recovering the combustible solvent and a gas jet flowing from an inlet port into the chamber, with said recovering means being situated within said chamber whereby the combustible solvent is recovered without contact of the combustible solvent with the noncombustible storing liquid;

2. A cleaning device according to claim 1 characterized in that the stored liquid is water.

3. A cleaning device according to claim 1 characterized in that the stored liquid is a noncombustible oil having a high boiling point.

4. A cleaning device according to claim 1 further comprised of a combustible terpene solvent.

5. A cleaning device according to claim 4 characterized in that the solvent is further comprised of a terpene emulsifying surface active agent.

6. A cleaning device according to claim 1 further comprised of a combustible alcohol solvent.

7. A cleaning device according to claim 1 further comprised of a combustible solvent characterized in that the combustible solvent is kerosene.

8. A cleaning device according to claim 1 characterized in that contact between the combustible solvent and the object at the cleaning part is carried out by injecting the combustible solvent in shower form.

9. A cleaning device according to claim 1 characterized in that the covering member is positioned in such a way as to be raised and lowered with respect to the stored liquid so that the inlet part can be inserted into the stored liquid and the covering chamber can be sealingly closed with the stored liquid in the cleaning operation.

10. A cleaning device according to claim 1 characterized in that a feeding of the object into the covering chamber is carried out from the inlet port and at the same time a feeding-out of the cleaned object from the covered chamber is carried out through the stored liquid.

11. A cleaning device comprised of:
a storage tank suitable for storing a noncombustible storing liquid;
a covering member having a lower end opening inserted into the storage tank, said covering member and non-combustible liquid, when in use, forming a chamber such that during use, the lower end opening of the covering member is below the surface of the non-combustible liquid contained within the storage tank;
said covering member further having a feed inlet adapted to pass an object to be cleaned into said chamber, and said lower end opening further acting as an opening for the object to exit said chamber;
a cleaning part situated within the chamber for performing a cleaning operation by contacting the object to be cleaned with a combustible solvent within the chamber, said cleaning part being comprised of a charging tank for containing the combustible solvent, a pump for pumping the combustible solvent, and at least one shower for contacting the object with the combustible solvent within the chamber; wherein said device is further comprised of recovering means for recovering the combustible solvent,
with said recovering means being situated within said chamber whereby the combustible solvent is recovered without contact of the combustible solvent with the noncombustible storing liquid.

12. A cleaning device in accordance with claim 11, wherein the covering member is moveable in the upward and downward directions.

13. A cleaning device in accordance with claim 12, wherein the feed inlet is in an open position when the covering member is in an upward position.

14. A cleaning device in accordance with claim 11, wherein the at least one shower is comprised of a plurality of showers.

* * * * *